XR 3,705,309

United States Patent

Brody

[15] 3,705,309

[45] Dec. 5, 1972

[54] THIN FILM OPTOELECTRONIC SEMICONDUCTOR DEVICE USING LIGHT COUPLING

[72] Inventor: Thomas P. Brody, Pittsburgh, Pa.

[73] Assignee: Westinghouse Electric Corporation, Pittsburgh, Pa.

[22] Filed: Feb. 5, 1971

[21] Appl. No.: 112,972

[52] U.S. Cl. .........250/217 S, 250/211 J, 250/213 R, 250/217 SS, 307/298, 317/234 S, 317/235 N

[51] Int. Cl. ............................G02f 1/28, H01j 39/12

[58] Field of Search.......307/298; 250/211 J, 217 SS, 250/227, 213 R, 217 S; 317/235 N, 234 S; 250/217 S

[56] References Cited

UNITED STATES PATENTS

| | | | |
|---|---|---|---|
| 3,043,958 | 7/1962 | Diemer | 250/211 |
| 3,043,959 | 7/1962 | Diemer | 250/211 |
| 3,229,104 | 1/1966 | Rutz | 250/211 J |
| 3,283,160 | 11/1966 | Levitt et al. | 250/213 |
| 3,369,132 | 2/1968 | Fang et al. | 250/211 J X |
| 3,403,306 | 9/1968 | Haitz et al. | 317/235 N |
| 3,200,259 | 8/1965 | Braunstein | 307/88.5 |
| 3,476,942 | 11/1969 | Yanai et al. | 250/213 |

*Primary Examiner*—Stanley D. Miller, Jr.
*Attorney*—F. Shapoe and Lee P. Johns

[57] ABSTRACT

An electro-optical switch composed of a film of semiconductor material, such as for example CdS, CdSe, containing suitable dopants and in which a first electro-luminescent region for generating photons of radiation is disposed in one portion of the film and a second photo-conductive region for receiving the photons is disposed in another portion of the film, which film has a thickness of from about 2000 A to about 3 microns, and means being provided for inducing the generation of photons in the first region, optically guiding the photons in the plane of the film to the second region and for receiving the photons in the second region.

16 Claims, 7 Drawing Figures

WITNESSES

Theodore F. Wrobel

James F. Young

INVENTOR

Thomas P. Brody

BY Lee P. Johns

ATTORNEY

THIN FILM OPTOELECTRONIC SEMICONDUCTOR DEVICE USING LIGHT COUPLING

BACKGROUND OF THE INVENTION

1. Field of the Invention

This invention relates to optoelectronics and more particularly it pertains to light propagation in the plane of optoelectronic elements that involve the phenomena of generation and absorption of recombination radiation.

2. Description of the Prior Art

Since the late 1950s, research efforts have been directed toward solid state electroluminescence. There has been considerable current interest in functional electronic blocks which involve optical rather than electrical coupling between elements. One reason for that interest is to extend the boundaries of the functional block art. Another reason is to benefit from the specific advantages offered by optical coupling, such as input-output isolation, high on/off ratios, high fan-in and fan-out capability, as well as potential increase in speed, the saving of power consumption and energy cost.

Most investigations have been based upon the use of GaAs or Ga(AsP) p-n junction luminors coupled to detectors of Si or GaAs with the coupling path being normal to the junction plane. While the luminors, particularly the GaAs diode, are known to be fairly efficient, the problems of topology, of coupling the emitter and detector efficiently, and the severe problems of incorporating a variety of materials and interfaces in the same block make this approach technically difficult without offering commensurate circuit advantages.

A number of disadvantages are inherent in the structures investigated and reported in the prior art. Some of those disadvantage include inefficient extraction of light, and the presence of absorbing and inactive regions between the light emitting and light absorbing regions of the device.

U.S. Pat. No. 3,229,104 discloses a four terminal electro-optical semi-conductive device using light coupling between light-emitting and light-absorbing p-n junctions, using GaAs as a semiconductor material. Such a device suffers from the disadvantage that most of the light generated in the junction region is propagated in a direction parallel to the junction and is hence not actually collected in any of the configurations described in the said invention. Further, the small amount of light propagated in the direction of the light-absorbing junction has to pass through a heavily absorbing region before it can enter the coupling region. For these reasons, the device described has low efficiency. In addition, the device described is restricted to the utilization of recombination radiation generated in a GaAs p-n junction, and does not utilize other materials and other means of generating photons, for example, impact ionization, tunnel-injection luminescence, Destriau-luminescence or others. Likewise, the patent is restricted to the utilization of a p-n junction photon-collector, and employs no other means of light absorption, such as photoconductive effects. The geometries described in the said patent are not suited for the construction of the complex logic circuits described in the present invention, as multiple fan-in and fan-out connections become impractical due to the low efficiency of the light extraction. Finally, the geometry, materials and construction of the said patent do not permit the realization of multilayer electro-optical hybrid systems, as are claimed in the instant invention.

SUMMARY OF THE INVENTION

It has been found in accordance with this invention that the optoelectronic device is based upon the principle of light propagation in the plane of a thin film circuit rather than transversely to the plane of the junction. The basic element of this invention consists of a thin film having a thickness of from about 1 to about 3 microns of a semiconductor material, such as, for example, CdS, CdSe, CdTe, GaAs, GaP, InAs, and GaAlAs, and comprising an electro-luminescent region (EL), a photoconductive region (PC), and an intermediate region disposed between the EL and PC regions and otherwise known as a "light pipe," and the electro-luminescent region generating and propagating photons of radiation in zones that are substantially parallel to the plane of the film and the photoconductive region receiving the photons of radiation in zones that are substantially parallel to the plane of the film.

BRIEF DESCRIPTION OF THE PREFERRED EMBODIMENTS

Figure 1:
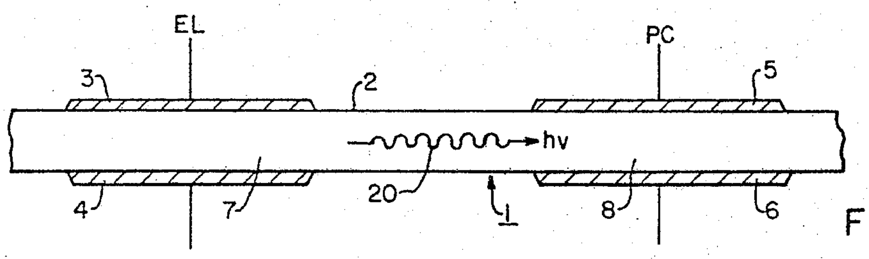
FIG. 1 is a schematic diagram of a thin film optoelectronic device in accordance with the present invention.

One form of the invention is the device generally indicated at 1 in FIG. 1. It includes an elongated thin film 2, a pair of electrodes 3 and 4, and another pair of electrodes 5 and 6. The electrodes 3 and 4 are disposed on opposite sides of a light-generating portion 7 of the thin film 2, and the electrodes 5 and 6 are on opposite sides of a photoconducting portion 8 of the film.

The method by which the device 1 is produced includes the steps of (1) depositing the spaced electrodes 4 and 6 on a suitable substrate (not shown) such as glass either by vacuum evaporation or sputtering of a metal; (2) depositing the optical film 2 either by vacuum evaporation, sputtering, or thermal transport over the spaced electrodes 4 and 6; (3) depositing a dopant into the light-generating portion 7 of the film 2; (4) diffusing another dopant into the photoconducting portion 8 of the film 2; and (5) depositing the spaced electrodes 3 and 5 onto the respective portions 7 and 8 of the film 2 and above the electrodes 4 and 6, respectively.

Deposition of the metal electrodes 4 and 6 by vacuum evaporation or sputtering is performed by either (a) depositing a continuous metal film and then selectively etching a portion of the film away to provide the separate electrodes, or (b) providing a stencil through which the electrodes 4 and 6 are selectively deposited. The metal of the electrodes 4 and 6 may be selected from the group consisting of gold, silver, and platinum and have a thickness ranging from about 500 to 2000 A and preferably about 1000 A. Where the electrode 4 is composed of a metal different from the electrode 6, the electrodes are deposited separately. For example, the electrode 4 may be composed of gold, silver, or platinum while the electrode 6 may be composed of another metal such as indium or gallium.

The film 2 has a thickness of from about 1 to 3 microns. The film 2 must have a higher refractive index than the substrate in order to confine the light within its boundaries. It consists of a Group II–VI or Group III–V compound. For example, compounds of the Group II–VI include ZnS, ZnSe, CdS, CdSe, and CdTe; and examples of Group III–V compounds include GaAs, InAs, GaP, and AlAs. The film 2 is composed of one continuous material, preferably CdS.

Figure 3:
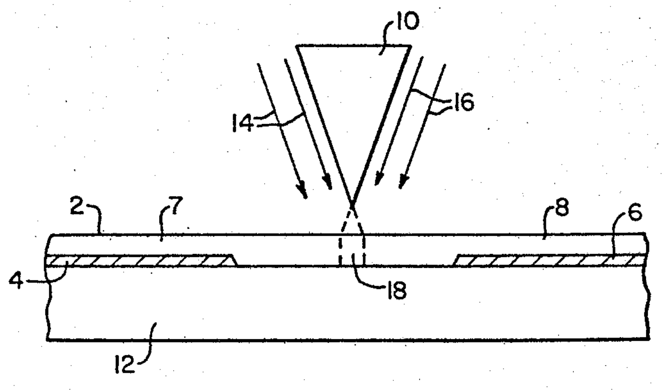
FIG. 3 is an illustration of one method of depositing the thin film on a suitable substrate.

In the alternative, the film 2 may be composed of two of the foregoing materials, for example, one of the materials may be CdS and the other may be CdSe. Where the film 2 is composed of a single material, such as CdS, it is applied over the spaced electrodes 4 and 6 to the desired thickness as shown in FIG. 1.

Where the film 2 is composed of two materials, they may be applied by the use of a mask 10 (FIG. 3) which is placed over a substrate 12, such as glass, with CdS applied on one side of the mask, as indicated by the arrows 14, and with CdSe applied on the other side of the mask 10, as indicated by the arrows 16. As a result, the portion of the film 2 deposited on the electrode 4 is composed of CdS while a portion of a film deposited over the electrode 6 is composed of CdSe. This procedure will result in an efficient EL-PC device of a "stepped-gap" construction. In such a construction, the edge-emission radiation from a wider bandgap EL region 7 is completely absorbed by a narrower bandgap PC region 8. Suitable material pairs for such structures, in addition to CdS and CdSe are CdSe and CdTe, GaP and GaAs, InP and InAs. Ternary compounds of these materials, for example $Cs(S_x Se_{1-x})$ or $Cd(Se_x Te_{1-x})$ (where $x$ ranges from 0 to 1) exhibit a nearly linear change of energy gap with composition $x$, and in the intermediate region 18 of FIG. 3, therefore a gradual transition from a wider to a narrower bandgap material will take place, provided a method of fabrication is employed which permits the formation of homogenous mixtures of the two component compounds in this region. As shown in FIG. 3 an intermediate homogeneous portion 18 of the film 2 may be provided between the portions of CdS and CdSe due to an overlap of said portions of material, which portion 18 is composed of both compounds; namely, CdS and CdSe. The width of the intermediate portion 18 is to be small, a dimension of about 1 mil is preferred.

Using such a co-evaporative technique, it is possible to predope the starting materials, and, by the use of two deposition steps (i.e. two different sources and maskings), provide the luminescent and photoconductive regions, respectively, without further treatment. Alternatively, suitable dopants are separately deposited on the spaced portions 7 and 8. For the case of CdS and CdSe, the light rendering or electroluminescent (EL) portion 7 is doped with at least one element selected from the group consisting of Cu, Cl, and Mn. The photoconductive (PC) portion 8 is doped with an element selected from the group consisting of cadmium, gallium, copper, and silver. The dopants for both regions or portions 7 and 8 are applied to the film either by heating in a conventional tube furnace under continuous flow methods with the use of suitable masking techniques to prevent cross-contamination, such as an oxide masking technique; or by depositing the dopant on the film surface and then annealing at a suitable temperature to permit absorption of the dopant by the film.

The top electrodes 3 and 5 are then applied on the film 2 opposite the electrodes 4 and 6. The electrodes 3 and 5 are composed of metals selected from the group consisting of In, Cd, Ga, and Al.

In operation, when a signal of suitable voltage is applied across the electrodes 3 and 4 light or photons of radiation ($h\nu$) are generated in the EL region 7 from where they are propagated as shown schematically by the arrow 20 in FIG. 1. More particularly, the photons generated in the EL region or portion 7 of the film 2 are the result of a phenomenon of recombination radiation whereby charge carriers or holes and electrons in the region 7 recombine and produce photons. The photons of radiation ($h\nu$) propagate through the intermediate portion of the film 2 and are absorbed in the PC region or photoconductive portion 8 and are converted to photo-current by a voltage applied to electrodes 5 and 6.

Figure 2:
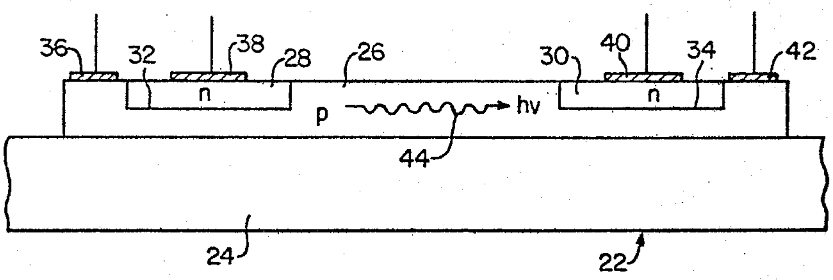
FIG. 2 is a schematic diagram of another thin film optoelectronic device of this invention.

In FIG. 2 a device generally indicated 22 is mounted on a substrate 24 which is a semi-insulating or insulating material such as glass, sapphire, and spinel, and produces the desired results. The device 22 includes a thin film 26 of semiconductor material in which the phenomena of recombination radiation light-guiding and absorption take place. The device 22 also Includes a pair of spaced regions 28 and 30. The film 26 is composed of either p or n type semiconductor material while the regions 28 and 30 are composed of the same semiconductor material doped to an opposite type of conductivity. For purposes of illustration as shown in FIG. 2 the film 26 is composed of a p type material and the regions 28 and 30 are composed of *n* type material. Accordingly, a p-n junction 32 is provided between the region 28 and the film 26, and a p-n junction 34 is provided between the region 30 and the film 26. As shown in FIG. 2, a substantial portion of the p-n junctions 32 and 34 are disposed in planes substantially parallel to the planar axis of the film 26.

The film 26 is composed of a semiconductor of the group III-V compounds, for example, GaAs GaP, InAs, InP, and AlAs. It is deposited either by homoepitaxy or heteroepitaxy deposition to a thickness of from about 1 to 3 microns on the substrate 24. Thereafter, the regions 28 and 30 are diffused by conventional diffusion methods. Electrodes 36, 38, 40, and 42 are then applied by conventional means, to form ohmic contacts to the p- and n- regions. As shown in FIG. 2, the electrode 36 is disposed on the side of the region 28 remote from the region 30, and the electrode 42 is similarly disposed with respect to its corresponding region 30. Both electrodes 36 and 42 are preferably proximate to their corresponding regions 28 and 30.

In operation, when a difference of potential is applied through the electrodes 36 and 38 in such a manner as to forward bias the junction 32, the phenomenon of recombination radiation occurs along the p-n junction 32, whereby photons of radiation are generated and propagated from the p-n junction 32 and as shown by the arrow 44. The photons are then absorbed by the p-n junction 34 and converted into charge carriers of increased current output through the electrodes 40 and 42.

The films 2 and 26, having a higher refractive index than the substrates act as dielectric wave guides or light pipe means for extraction of the photons along the plane of the junction; namely, in the plane of the film 2 between the electrodes 3 and 4 as well as the p-n junction 32 within the film 26. The photon is directed within the upper and lower surfaces of the film without passing through any barrier or optical boundary as is required by the construction shown in U.S. Pat. No. 3,229,104.

Small dimensions in close spacing of the several parts of the devices 1 and 22 are utilized in order to maintain maximum efficiency. For example, in a film having a thickness of from about 2 to 3 microns the lateral separation between the EL and PC regions can be about 25 microns (1 mil) or less, while still insuring that the fringing areas constitute only a small part of the separation distance and the only interaction is optical.

Other advantages are obtained from this construction. Total internal reflection losses due to refractive index discontinuity, a severe problem in GaAs luminors, disappear. The geometry is essentially planar, and multilayer blocks can easily be conceived. Optical and electrical fan-in and fan-out are both easily and simply realizable. Optical signals can intersect each other's path in the same plane without interaction (elimination of the crossover problem). The photoconductor gain can be quite high, because the transit time through the film is small. Finally, the possibility exists of combining optoelectronic logic with thin-film transistor amplifying stages or, more generally, constructing a hybrid system with optical and electronic elements interconnectable in any specific manner desired by the logic designer.

Figure 4:
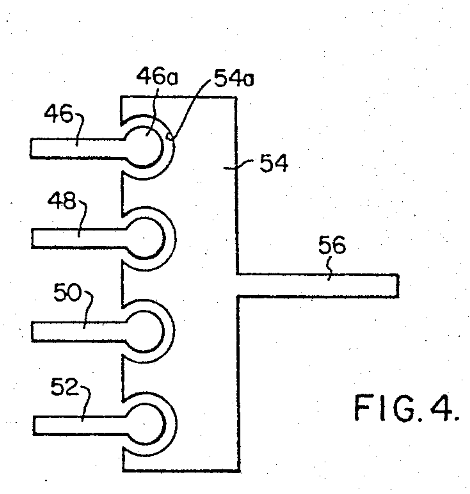
FIGS. 4 to 7 illustrate examples of various logic gates obtainable from the basic element of FIGS. 1 and 2.

In FIGS. 4 to 7 various simple logic gates and elements are disclosed as illustrative of the basic elements of FIGS. 1 and 2. In FIG. 4 a plurality of spaced inputs 46, 48, 50, and 52 having compositions and characteristics similar to the electroluminescent or light-rendering region 7 of FIG. 1 are provided with enlarged peripheral end portions such as portion 46*a* which are almost completely enclosed within peripherally spaced openings 54*a* of a photoconductive region 54 similar to the photoconductive region 8 of FIG. 1. A PC output region 56 extends from the region 54. The device shown in FIG. 4 is comparable to an EL-PC NOR gate wherein the output is equal to "one" (positive) only if none of the inputs 46–52 is a "one".

Figure 5:
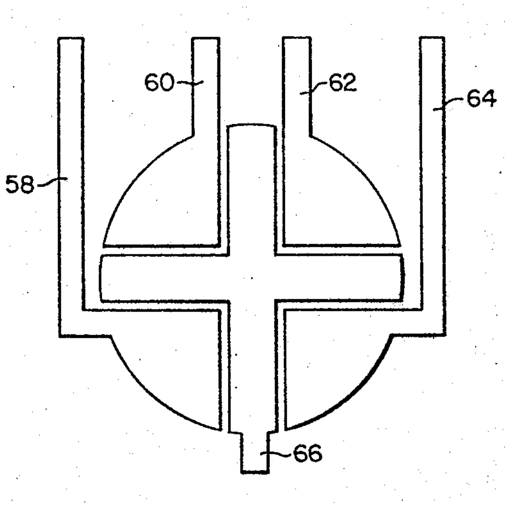

In FIG. 5 an alternative construction for the NOR gate of FIG. 4 is shown in which a plurality of EL input regions 58, 60, 62, and 64 are disposed in quantum areas between the portions of a PC output region 66 having a cross-like configuration.

Figure 6:
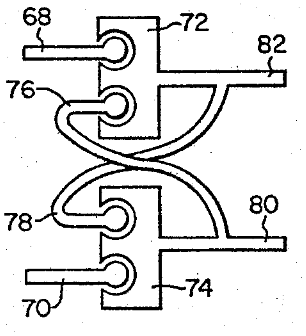

In FIG. 6 an EL-PC flip-flop switch is provided with a pair of EL input regions 68 and 70 (similar to the input regions 46–52 of FIG. 4) in combination with a pair of PC input regions 72 and 74. In addition, a pair of crossover input like regions 76 and 78 are provided with the regions 76 connecting with a lead 80 from the output region 74 and with the region 78 connecting with a lead 82 of the region 72.

Figure 7:
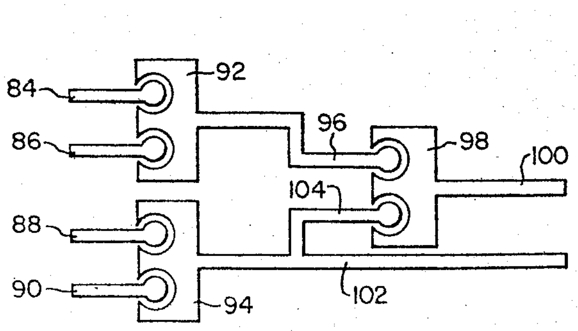

Still another combination of EL and PC regions is shown in FIG. 7 in which a plurality of EL input regions 84, 86, 88, and 90, similar to regions 68 and 70 of FIG. 6, are provided in combination with a pair of PC regions 92 and 94. A lead 96 extends from the region 92 and forms an EL input for another PC region 98 which in turn is provided with an outlet lead 100. Likewise, the PC region 94 is provided with a lead 102 which includes an EL input region 104 which like the lead 96 is associated with the PC region 98. The device of FIG. 7 provides a half-adder or exclusive OR construction.

The devices of FIGS. 4 to 7 indicate the versatility of the "planar" EL-PC logic. Analog and linear circuits may be likewise provided as basic elements of the device of FIG. 1 and will have an analog output which may be linear over a useful range which is dependent upon the material properties and particularly that of the EL diode region.

Accordingly, the device of the present invention provides for a thin film optoelectronic device based upon the principle of light propagation in the plane of a thin film circuit rather than transverse to the plane of the junctions as in the conventional approach.

What is claimed is:

1. An optoelectronic thin film device comprising a thin film body of semiconductor material disposed on an electrically insulating substrate, said thin film body having a higher refractive index than the substrate, the body having an electroluminescent region and a photoconductive region spaced from each other, first means applied to the body for inducing the generation of photons of radiation in the electroluminescent region of the body in a plane parallel to a body axis extending between the regions, nd second means for receiving the photons in the photoconductive region, whereby a high photoconductor gain is obtained.

2. The device of claim 1 wherein the semiconductor material is at least one material selected from the group consisting of Group III-V compounds and Group II–VI compounds.

3. The device of claim 1 wherein the semiconductor material is at least one material selected from the group consisting of CdS, CdSe, CdTe, ZnS, ZnSe, GaAs, GaP, InAs, InP, AlAs, GaAlAs, $Cd(S_x Se_{1-x})$, $Cd(Se_x Te_{1-x})$, where x ranges from 0 to 1.

4. The device of claim 1 wherein the body of semiconductor material is of a first type of semiconductivity, the means for inducing and receiving photons include spaced regions of a second-type of semiconductivity in the body which regions each form a p-n junction with the body, the substantial portion of which is disposed in a plane parallel to the plane extending between the regions, and the body of semiconductor material consisting of a Group III-V compound.

5. The device of claim 4 wherein the semiconductor material is at least one compound selected from the group consisting of GaAs, GaP, InAs, InP, AlS, and GaAlS.

6. The device of claim 1 wherein the body consists essentially of CdS.

7. The device of claim 1 wherein the electroluminescent region of the body consists of CdS, and the photoconductive region consists of CdSe.

8. The device of claim 7 wherein an intermediate overlap region is disposed between the electroluminescent region and the photoconductive region and is composed of a homogeneous mixture of CdS and CdSe.

9. The device of claim 1 wherein luminescent region contains a dopant selected from a group consisting of Cu, Cl, and Mn, and the photoconductive region contains a dopant selected from a group consisting of Cd, Ga, Cu, and Ag.

10. The device of claim 1 wherein the body has a thickness of from about 2000 A to about 3 microns.

11. The device of claim 1 wherein the means for inducing the generation of photons in the electroluminescent region are a pair of electrodes on opposite sides of the luminescent region.

12. The device of claim 1 wherein the means for receiving the photons in the photoconductive region are electrodes on opposite sides of the photoconductive region.

13. The device of claim 1 wherein the means for inducing the generation of an for receiving the photons are electrodes on opposite sides of the regions.

14. The device of claim 1 wherein the electroluminescent and photoconductive regions are separated by a distance of 1 mil.

15. An optoelectronic thin film device comprising a substrate of an insulating material; a body on the substrate and composed of semiconductor material of at least one compound selected from the group consisting of GaAs, GaP, InAs, InP, AlS, and GaAlS; the body having a pair of spaced regions containing a dopant of one of the n and p types and the body containing a dopant of the opposite type, the doped regions each forming p-n junctions the substantial portions of which are disposed in planes parallel to an axis extending between the regions, one of the regions being electroluminescent and the other region being photoconductive, both regions being in one surface of the body, a pair of electrodes affixed to the surface, and an electrode affixed to each of the regions.

16. The device of claim 15 wherein he body is doped with a p-type dopant and the regions are doped with an n-type dopant.

* * * * *